United States Patent
Toyonaga et al.

(10) Patent No.: US 6,263,475 B1
(45) Date of Patent: Jul. 17, 2001

(54) METHOD FOR OPTIMIZING COMPONENT PLACEMENT IN DESIGNING A SEMICONDUCTOR DEVICE BY USING A COST VALUE

(75) Inventors: Masahiko Toyonaga, Hyogo; Toshiro Akino, Osaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/192,231

(22) Filed: Nov. 16, 1998

(30) Foreign Application Priority Data

Nov. 17, 1997 (JP) .................................... 9-314723

(51) Int. Cl.$^7$ .................................... G06F 13/00
(52) U.S. Cl. .................................... 716/2
(58) Field of Search ................. 711/147; 716/2

(56) References Cited

U.S. PATENT DOCUMENTS 5,963,975 * 10/1999 Boyle .................................... 711/147

FOREIGN PATENT DOCUMENTS 1-260582   10/1989  (JP) .
2-242474    9/1990  (JP) .

OTHER PUBLICATIONS

S. Kirkpatrick et al. "Optimization by Simulated Annealing", Science, vol. 220, No. 4598, pp. 671–680, May 1983.

* cited by examiner

Primary Examiner—Matthew Smith
Assistant Examiner—Thuan Do
(74) Attorney, Agent, or Firm—Eric J. Robinson; Nixon Peabody LLP (57) ABSTRACT

An initial placement is performed based on a net list and a cell library. An optimum effective temperature Tc is derived based on a cost value obtained if the positions of two components, selected from a list of exchange candidates (where all the components are registered), are exchanged with each other and a cost value before the exchange is performed. A first component and a second component, adjacent to the first component, are selected from the list of exchange candidates and the positions thereof are exchanged with each other. And at the optimum effective temperature Tc, it is determined in accordance with a Monte-Carlo method using the cost values before and after the exchange whether or not the exchange is allowable. If it is allowable, the placement after the exchange is decided as a new placement. Otherwise, the placement before the exchange is decided as a new placement. Subsequently, new placements are decided N times for each component included in the list of exchange candidates, and candidate components, the exchange number M of which is equal to or larger than a predetermined number Nm (where Nm<N), are registered to draw up a new list of exchange candidates. And the respective processing steps from deriving the optimum effective temperature Tc to registering the candidate components are repeatedly performed by using the new list of exchange candidates.

4 Claims, 5 Drawing Sheets

| NUMBER Ne OF COMPONENTS | METHOD OF THE INVENTION | | |
|---|---|---|---|
| | OPTIMUM EFFECTIVE TEMPERATURE Tc | COST VALUE (TOTAL WIRE LENGTH) | ITERATIVE NUMBER OF OPTIMIZATION PROCESSES |
| 5×5 | 1.5 | 60 | 4320 |
| 8×8 | 1.35 | 150 | 26235 |
| 10×10 | 1.344 | 274 | 62910 |

| NUMBER Ne OF COMPONENTS | PAIR-WISE EXCHANGE | | SIMULATED ANNEALING (Ts(HIGH)=10.0, Te(LOW)=0.5) | |
|---|---|---|---|---|
| | COST VALUE (TOTAL WIRE LENGTH) | ITERATIVE NUMBER OF OPTIMIZATION PROCESSES | COST VALUE (TOTAL WIRE LENGTH) | ITERATIVE NUMBER OF OPTIMIZATION PROCESSES |
| 5×5 | 110 | 2500 | 60 | 5000 |
| 8×8 | 356 | 16384 | 144 | 53248 |
| 10×10 | 598 | 50000 | 226 | 460000 |

METHOD FOR OPTIMIZING COMPONENT PLACEMENT IN DESIGNING A SEMICONDUCTOR DEVICE BY USING A COST VALUE

BACKGROUND OF THE INVENTION

The present invention relates to a method for optimizing the placement of components in designing a semiconductor device.

A simulated annealing (SA) method, one of combinatorial optimization methods, was proposed by S. Kirkpatrick et al. in "Optimization by Simulated Annealing", SCIENCE, Vol. 220, No. 4598, pp. 671–680, May 1983. The SA method is used for carrying out a combinatorial optimization by adopting a Monte-Carlo (MC) method, which is a computer simulation method in thermodynamics. In accordance with the SA method, a temperature and an energy value defined in thermodynamics are respectively replaced with an effective temperature as a parameter and the value of an estimate (i.e., a cost value) used for estimating a placement produced in a combinatorial problem. Specifically, first, a cost value is obtained by exchanging the positions of two components selected from a placement produced at an effective temperature T. And then it is determined in accordance with the MC method using the cost value whether or not the exchange is allowable. If it has been determined that the exchange is not allowable, then the two components are returned to their original positions and another pair of components are newly selected from the placement. Alternatively, if it has been determined that the exchange is allowable, then another pair of components are newly selected from the modified placement reflecting the exchange, and the positions of the two components selected are exchanged with each other, thereby obtaining a cost value. This determination is carried out N times, which is a predetermined number of times the placement should be improved, thereby optimizing the component placement at the effective temperature T. In accordance with the SA method, the component placement is optimized at an effective temperature (high temperature) Ts, which is slowly lowered by a predetermined temperature every time. At every effective temperature lowered, the optimized placement is further optimized. By repeatedly performing this procedure, the temperature is slowly cooled down to an effective temperature (low temperature) Te. And a near-optimal solution can be found by regarding the placement at the effective temperature (low temperature) Te as an optimal solution.

Figure 4A:
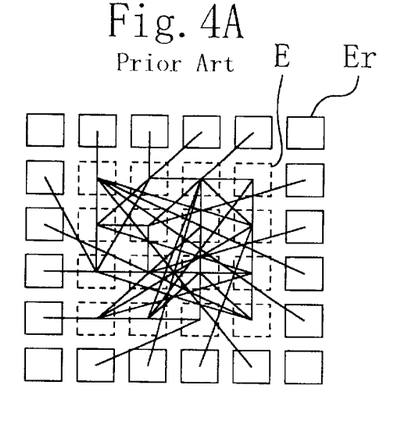
FIG. 4A is a diagram illustrating an initial placement during a process for optimizing a placement in accordance with the conventional SA method.
Figure 4B:
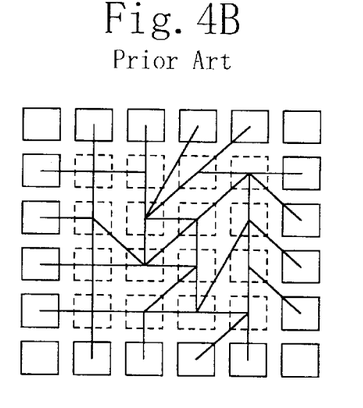
FIG. 4B is a diagram illustrating a placement at an intermediate stage of the optimization.
Figure 4C:
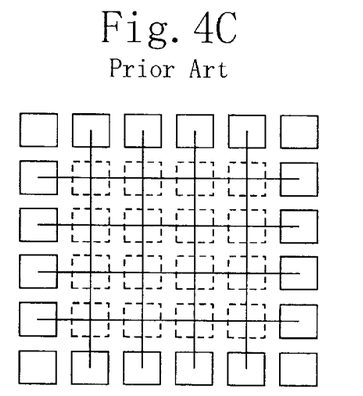
FIG. 4C is a diagram illustrating an optimum placement when the optimization is ended.

FIGS. 4A through 4C are diagrams illustrating a process for optimizing the placement of components (e.g., standard cells) by applying the SA method to a placement model so as to optimize a cost value (i.e., a total wire length). In this placement model, each component is bonded to four surrounding components (i.e., a four-direction bonding is implemented). A component located in the central 4×4 grid (where number Ne of components=16) is a component E to be placed, while a peripheral component Er is a fixed component. The distance between adjacent components is a unit distance of 1. The combinatorial problem is a problem of obtaining an optimum placement from an initial placement in which components are placed at random as shown in FIG. 4A. In accordance with the SA method, an optimum placement shown in FIG. 4C is obtained from the initial placement shown in FIG. 4A via an intermediate placement shown in FIG. 4B by slowing lowering the effective temperature T.

Figure 5:
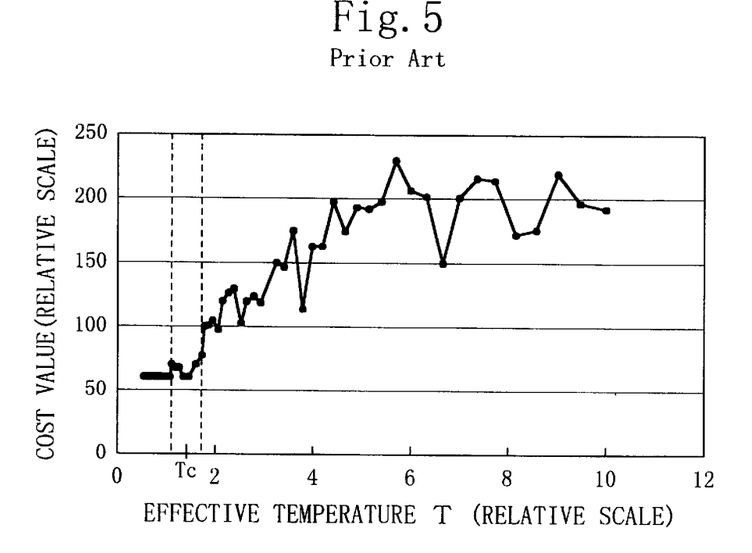
FIG. 5 is a graph illustrating a relationship between an effective temperature T and a cost value in accordance with the conventional SA method where the number Ne of components is 25 (=5×5).

Next, it will be described with reference to FIG. 5 how the cost value changes according to the SA method. FIG. 5 is a graph illustrating a relationship between an effective temperature T and a cost value where the number Ne of components is 25 (=5×5). The effective temperature T and the cost value are both represented by relative scales. While the effective temperature T is in the range from 10.0 to 4.0, the cost value repeatedly increases and decreases to a large degree. By contrast, while the effective temperature T is in the range from 4.0 to 1.0, the cost value still repeatedly increases and decreases, but generally tends to decrease as the effective temperature T decreases. A quantity obtained by differentiating a cost value by an effective temperature T is a quantity corresponding to specific heat. In FIG. 5, Tc is a temperature, at which the specific heat reaches a peak, and can be found as a result of the slow cooling employed in the SA method.

Figure 6:
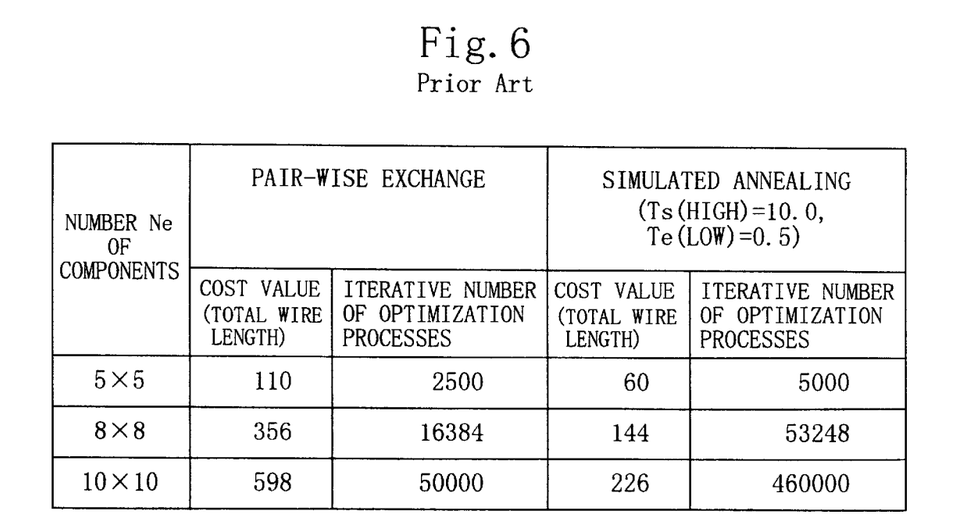
FIG. 6 is a table showing specific examples of the results obtained in accordance with the conventional PW and SA methods, respectively.

FIG. 6 is a table showing specific examples of the results obtained by a conventional pair-wise exchange (PW) method and the SA method. The pair-wise exchange method optimizes a placement by allowing components to be exchanged only when a cost value decreases. According to the SA method, each cost value, i.e., the total wire length, can be about a half to about a third of the counterpart obtained by the PW method. Therefore, a better solution (i.e., a better component placement) can be attained.

However, in accordance with the SA method, as the number of components increases, an iterative number of optimization processes drastically increases. As shown in FIG. 6, if the number Ne of components increases from 25 (=5×5) to 64 (=8×8) substantially threefold, the iterative number of optimization processes increases about elevenfold. And if the number Ne of components increases from 64 (=8×8) to 100 (=10×10) substantially twofold, the iterative number of optimization processes increases about ninefold. Accordingly, if one million or more transistors are to be placed in accordance with the SA method, then the process should be performed an enormous number of times. Thus, it is impossible to complete the process within a practical time.

SUMMARY OF THE INVENTION

The object of the present invention is to provide a method for optimizing a component placement that can attain a component placement as good as that obtained by the SA method by performing a smaller number of optimization processes.

The present invention was made with particular attention paid to the temperature Tc shown in FIG. 5. If the MC method is carried out at an effective temperature T in an approximate range from 1 to 2 (a region defined by the two broken lines), then the component placement would be improved and the iterative number of processes might be reduced as well as the case where the SA method is carried out while slowly cooling a high effective temperature. That is to say, according to the present invention, an optimum effective temperature is estimated in advance before the MC method is carried out.

As is well known, a ferromagnetic loses its magnetism at a high temperature. The temperature at which magnetism is lost is called a "phase transition temperature". The method for optimizing a component placement of the present invention is, as it were, a simulated phase transition (SPT) method. In accordance with this method, an effective temperature, at which transition from a state where a component placement is out of order to a state where the component placement is in order happens, i.e., a simulated phase transition temperature Tc, is employed as an optimum effective temperature. As described above, specific heat reaches its peak at the temperature Tc. In other words, Tc is a temperature at which a cost value can be improved most efficiently. On the other hand, Tc is also a temperature in a boundary where transition from the disordered state to the ordered state happens. Accordingly, at Tc, some of the components might already be in order. Thus, the number of times a component has been exchanged (hereinafter, simply referred to as an "exchange number" of a component) in accordance with the MC method is observed as a "mobility" at Tc. And based on an exchange probability proportional to the mobility, the placement is improved.

Specifically, according to the present invention, an optimum effective temperature (i.e., simulated phase transition temperature) Tc is obtained in the following manner. First, two components are selected at random out of a list of exchange candidates and the positions thereof are exchanged with each other. Then, a cost difference per unit distance is obtained by dividing a difference between cost values of respective component placements before and after the exchange by a Manhattan distance between these two components. A predetermined number n of cost differences per unit distance are obtained, and an average of the number n of differences is calculated and defined as Tc. The temperature Tc obtained in this manner corresponds to minimum energy required to disorder an ordered state.

Even if the conventional SA method is started at Tc obtained in this manner, an optimum placement can be attained faster than the conventional method. In order to realize even faster processing, in accordance with the SPT method of the present invention, first, Tc is obtained based on a list of exchange candidates where all the components are registered. Next, two components are selected out of the list of exchange candidates and the positions thereof are exchanged with each other at Tc. Then, the MC method is carried out to determine whether or not the exchange is allowable. Subsequently, some components, which have been exchanged a predetermined number of times or more, are selected from all the components to draw up a new list of exchange candidates. Since the components registered in the new list of exchange candidates are restricted by surrounding fixed components, Tc at this point in time should be lower than a previous one. Accordingly, Tc is obtained again based on the new list of exchange candidates. If this procedure is repeatedly performed, a cost value can be improved efficiently by employing Tc. In addition, the number of components included in the list of exchange candidates gradually decreases. As a result, the temperature at which the MC method is carried out can be lowered rapidly and automatically, not slowly.

DESCRIPTION OF THE PREFERRED EMBODIMENTS

Figure 1:
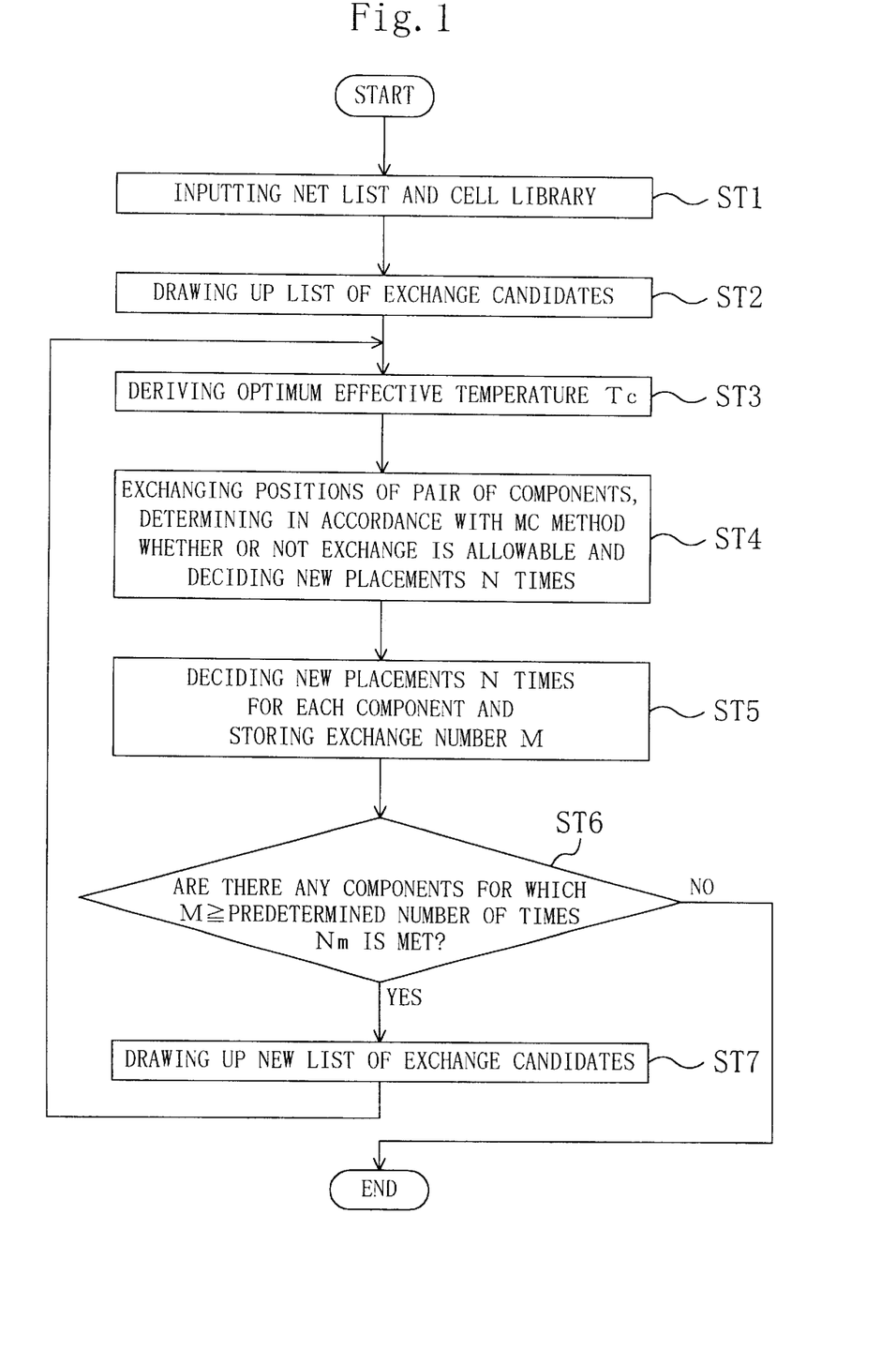
FIG. 1 is a flow chart illustrating a method for optimizing a component placement according to the present invention.

Hereinafter, a method for optimizing a component placement according to the present invention will be described with reference to the accompanying drawings. FIG. 1 is a flow chart illustrating the method for optimizing a component placement of the present invention. In the following description, a component to be placed is a standard cell, for example. And a total wire length is herein exemplified as a cost value.

First, in the first step ST1, a net list describing the interconnection relationship among respective components and a cell library, in which information about the cells used in designing a semiconductor device is stored, are input and an initial placement is performed.

Next, in the second step ST2, all the components included in the net list (where the number of components is represented by Ne) are registered and a list Le of exchange candidates is drawn up. The list Le of exchange candidates is a list describing instance information (i.e., identification information) and position information of the components. For example, as to the circuit shown in FIG. 4A, the components E to be placed, which are located in the central 4×4 grid (the total number Ne of components is 16) are registered in the list Le of exchange candidates. If the components E to be placed are identified by E1, E2, . . . , E16, respectively, then the list Le of exchange candidates is represented by the following Equation (1):

$$Le=\{E1, E2, E3, \ldots, E16\} \quad (1)$$

It is noted that the indication of position information is omitted herein.

Then, in the third step ST3, the positions of the number Ne (=16) of components included in the list Le of exchange candidates are exchanged with one another at random, and an average of differences between old and new cost values is obtained, thereby deriving an optimum effective temperature Tc. It will be described in more detail how Tc is obtained.

Subsequently, in the fourth step ST4, the placement of components is improved at the optimum effective temperature Tc in accordance with the MC method. A component is selected at random from the components included in the list Le of exchange candidates and regarded as a first component. Then, another component is selected at random from the eight components adjacent to the first component (including not only components E to be placed but also peripheral components Er), and regarded as a second component. After the positions of the first and second components have been exchanged with each other, it is determined in accordance with the MC method whether or not the exchange is allowable. In the MC method, the following determination Inequality (2), where $\Delta E$ is a cost difference between the cost values before and after the positional exchange at the optimum effective temperature Tc, is used.

$$\exp(-\Delta E/Tc) < \text{Rand}(1.0) \quad (2)$$

where Rand(1.0) is a random number generated for the value in the range from 1 to 0. If Inequality (2) is met, then the exchange is allowed. Otherwise, the exchange is not allowed but a processing step of returning the positions to the original ones is performed. In either case, the placement after the processing has been performed is decided as a new placement. In this manner, the positions of first and second components are exchanged and it is determined whether or not the exchange is allowable, thereby deciding a new placement. This decision is repeatedly performed N times, which is a predetermined number of times the placement should be improved.

Next, in the fifth step ST5, new placements are decided N times for every component included in the list Le of exchange candidates. For example, if the number Ne of components is 16 as in the circuit shown in FIG. 4A and if the number of times N is 100, then the total iterative number in the fourth and fifth steps ST4 and ST5 is: N×Ne=1600. If the position of a component has been exchanged at least once, then the number of times the position has been exchanged is recorded as an exchange number M. The exchange number M is obtained for each component.

Then, in the sixth step ST6, it is determined whether or not there is any candidate component, the exchange number M of which is equal to or larger than a predetermined number of times Nm, among all the components. If it has been determined that there is a candidate component, then the processing advances to the seventh step ST7. Otherwise, the component placement optimization is ended.

Subsequently, in the seventh step ST7, the candidate components are registered to draw up a new list of exchange candidates, and then the procedure returns to the third step ST3. In the third step ST3, the new list of exchange candidates is used instead of the list Le of exchange candidates, thereby obtaining an optimum effective temperature Tc. Thereafter, the third to the sixth steps ST3 through ST6 are repeatedly performed until there is no candidate components any more.

The determination in the sixth step ST6 has the following significance. Specifically, if the exchange number M of a component is relatively large, then the position of such a component can be regarded as being still far away from an optimum position. Conversely, if the exchange number M of a component is relatively small, then the position of such a component can be regarded as having already been improved to a considerable degree. Taking these points into consideration, if the predetermined number of times Nm is sufficiently small and yet there are no candidate components for which M≧Nm is met, then no further improvements will not be found even if the positions are exchanged. Accordingly, since processing for improving the placement is no longer necessary, the component placement optimization is ended. On the other hand, if there is any candidate component, then the placement is still to be improved by exchanging the positions. Thus, in such a case, a new list of candidate components is drawn up, an optimum effective temperature Tc is obtained and then the positions are exchanged, thereby carrying out the improvement.

Figure 2:
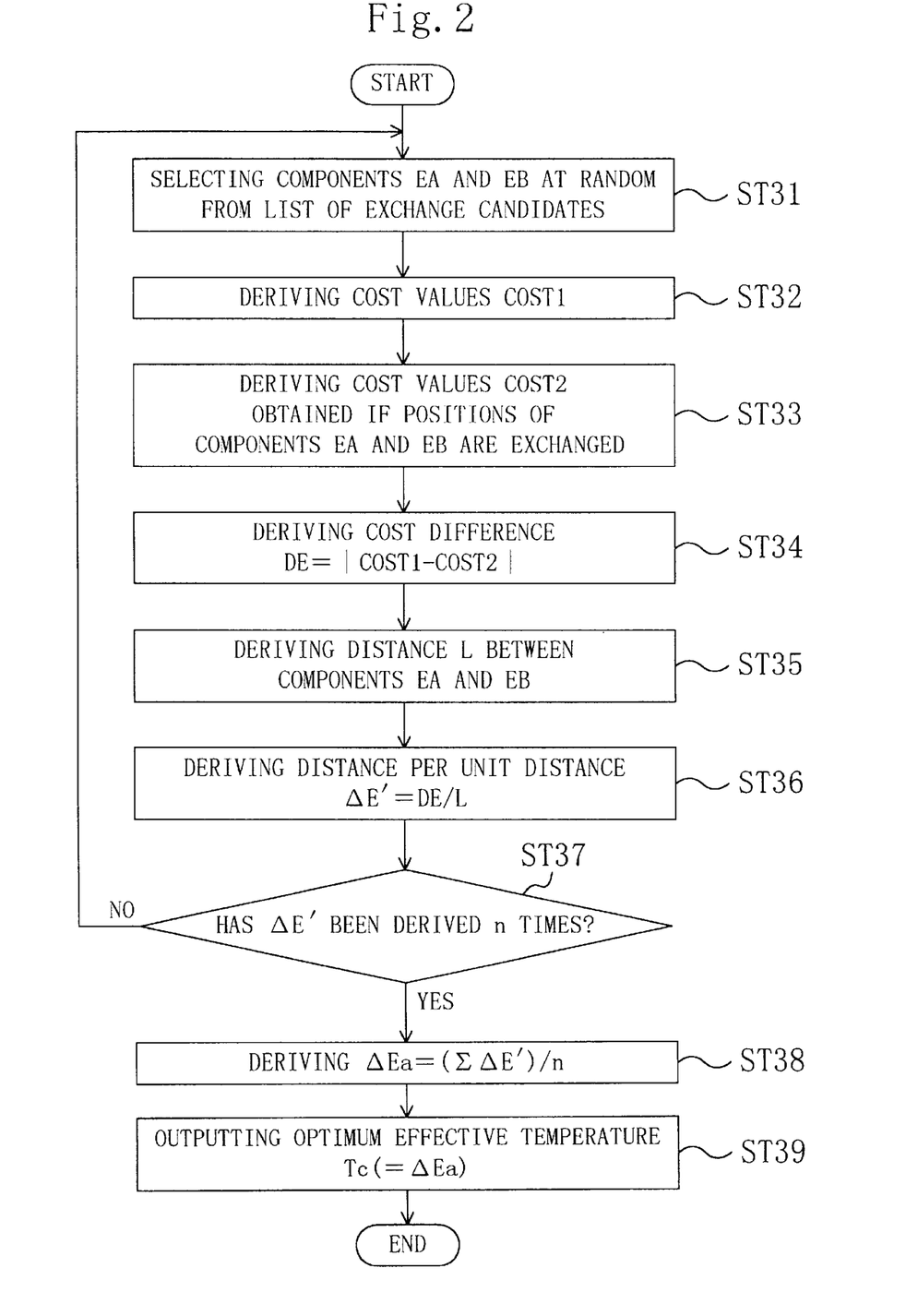
FIG. 2 is a flow chart illustrating how an optimum effective temperature Tc is obtained in accordance with the method for optimizing a component placement of the present invention.

Hereinafter, it will be described in further detail how the optimum effective temperature Tc is obtained. FIG. 2 is a flow chart illustrating how the optimum effective temperature Tc is obtained in accordance with the method for optimizing a component placement of the present invention. In the third step ST3 shown in FIG. 1, the optimum effective temperature Tc is obtained as shown in FIG. 2. In FIG. 2, first, in Step ST31, components EA and EB are selected at random from the list of exchange candidates. Next, in Step ST32, a cost value COST1 is derived. Then, in Step ST33, a cost value COST2, obtained if the positions of the components EA and EB are exchanged with each other, is derived. Subsequently, in Step ST34, a cost difference DE between the cost values COST1 and COST2 before and after the exchange is obtained as:

$$DE=|COST1-COST2|$$

Thereafter, in Step ST35, a Manhattan distance L between the components EA and EB is obtained. Next, in Step ST36, a cost difference $\Delta E'$ is obtained per unit distance with respect to the Manhattan distance L in accordance with the equation:

$$\Delta E'=DE/L$$

Subsequently, in Step ST37, it is determined whether or not the cost difference $\Delta E'$ per unit distance has been obtained n times, which is a predetermined number of times. If it has not, the processing returns to the step ST31. If it has, the processing proceeds to Step ST38. Next, in Step ST38, an average $\Delta Ea$ of the cost differences $\Delta E'$ per unit distance is obtained as:

$$\Delta Ea=(\Sigma\Delta E')/n$$

Finally, in Step ST39, the average $\Delta Ea$ is output as an optimum effective temperature Tc to end the processing. If two components selected in Step ST31 are defined as two mutually adjacent components, then the cost difference DE is equal to the cost difference $\Delta E'$ per unit distance, because the distance between such two components is one.

Figure 3:
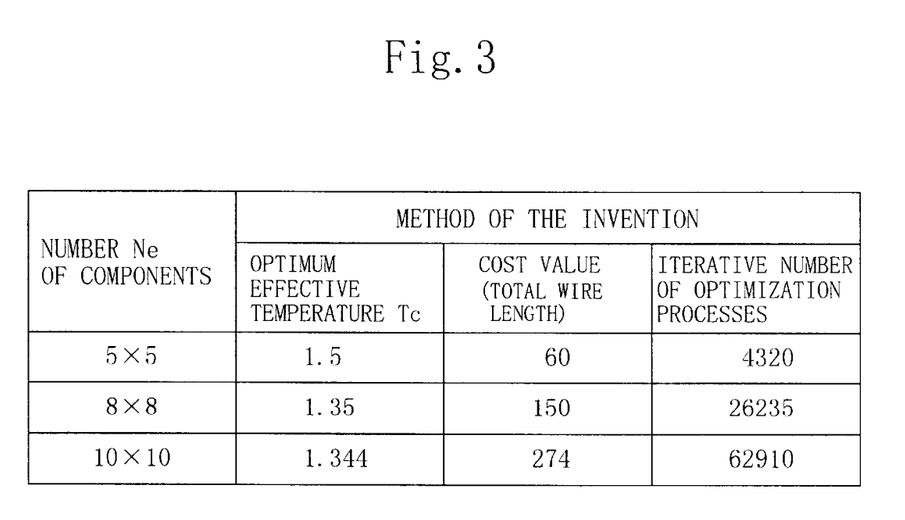
FIG. 3 is a table showing specific results obtained in accordance with the method shown in FIGS. 1 and 2.

FIG. 3 is a table showing specific results obtained in accordance with the method shown in FIGS. 1 and 2. In FIG. 3, the optimum effective temperatures Tc are obtained where the predetermined number n is 100. When the numbers Ne of components are 25 (=5×5), 64 (=8×8) and 100 (=10×10), the optimum effective temperatures Tc are 1.5, 1.35 and 1.344, respectively. Thus, the resultant optimum effective temperatures Tc are substantially equal to the temperature Tc, which is obtained by differentiating a cost value by an effective temperature T in FIG. 5, and where specific heat reaches its peak. Accordingly, if the MC method is performed at the optimum effective temperature Tc, a lower cost value is obtained by performing a smaller number of optimization processes, i.e., a better component placement can be obtained.

FIG. 3 also shows the iterative numbers of optimization processes and the cost values (total wire lengths), obtained as a result of the optimization, where the predetermined number Nm is 1, the number of times N the placement should be improved is equal to the number Ne of components, and the numbers Ne of components are 25 (=5×5), 64 (=8×8) and 100 (=10×10), respectively. As compared with the results obtained in accordance with the conventional SA method and shown in FIG. 6, it can be understood that substantially equal cost values are obtained in all of the cases where the numbers Ne of components are 25 (=5×5), 64 (=8×8) and 100 (=10×10) with iterative numbers of optimization processes decreased to 86%, 49% and 14%, respectively.

The generation and determination of random numbers, the derivation of the optimum effective temperature Tc and the like in accordance with the MC method can be processed with a central processing unit (CPU) of a computer. Accordingly, a program to make a computer operate in the following manner can be stored in a computer readable storage medium. First, the computer receives a net list and a cell library and performs an initial placement. Then, the computer registers all the components, draws up a list of exchange candidates and stores the list in a memory. Next, the computer selects two components out of the list of exchange candidates. Subsequently, the CPU derives an optimum effective temperature Tc based on a cost value obtained if the positions thereof are exchanged with each other and a cost value before the exchange is performed. Then, the computer selects a first component and a second component adjacent thereto from the list of exchange candidates stored in the memory and exchanges the positions thereof with each other. Next, the computer determines whether or not the exchange is allowable in accordance with the MC method based on the cost values before and after the exchange at the optimum effective temperature TC. If it is allowable, the placement after the exchange is decided as a new placement. Otherwise, the placement before the exchange is decided as a new placement. Subsequently, the computer determines new placements N times for each component included in the list of exchange candidates, and the CPU determines whether or not there are any candidate components, the exchange number M of which is equal to or larger than the predetermined number Nm (where Nm<N). If there are none, the component placement is ended. Alternatively, if there are some, then the computer registers the candidate components, draws up a new list of exchange candidates and stores the list in the memory. And the computer repeatedly performs the respective processing steps from deriving the optimum lo effective temperature Tc to registering the candidate components by using the new list of exchange candidates. In this manner, the computer can optimize the component placement.

In the foregoing description, the total wire length between components is used as a cost value. Alternatively, a circuit area, a signal delay time or the like may also be used as the cost value.

As described above, according to the present invention, an optimum effective temperature Tc is obtained beforehand. At the optimum effective temperature Tc, the positions of two components selected from a list of exchange candidates are exchanged with each other. Next, it is determined in accordance with the MC method whether or not the exchange is allowable. A component, the exchange number M of which is equal to or larger than a predetermined number Nm, i.e., a component which has been exchanged more frequently, is regarded as being still far away from its optimum position. And such components are registered to draw up a new list of exchange candidates. In other words, a component, the exchange number M of which is smaller than the predetermined number Nm, i.e., a component which has been exchanged less frequently, is regarded as having been placed at a position closer to its optimum position. And a new list of exchange candidates is drawn up so as to exclude such components. Then, an optimum effective temperature Tc is obtained again by using the new list of exchange candidates instead of the old list of exchange candidates.

That is to say, at an optimum effective temperature Tc corresponding to a cost value that has reached a relatively low value, it is determined in accordance with the MC method whether or not the exchange of the positions is allowable. Accordingly, a lower cost value, i.e., a better component placement, can be obtained by performing a smaller number of optimization processes. In addition, the optimum effective temperature Tc is obtained again based on a new list of exchange candidates where only the candidates components, the exchange number M of which is equal to or larger than a predetermined number Nm, are registered. And the component placement is improved at the optimum effective temperature Tc. Thus, as the processing proceeds, the number of candidate components decreases. The component placement can also be improved by performing a smaller number of optimization processes because of such a reason.

What is claimed is:

1. A method for optimizing a component placement in designing a semiconductor device, in which components are placed by using a cost value, the cost value being used for estimating the component placement and variable with an effective temperature as a parameter, the method comprising the steps of:

a) inputting a net list and a cell library and performing an initial placement;

b) registering all of a number Ne of components existing in the net list, and drawing up a list of exchange candidates;

c) selecting two components from the list of exchange candidates, obtaining the cost value of a component placement in which the positions of the two components are exchanged with each other and the cost value of a component placement before the exchange is performed, and deriving an optimum effective temperature based on the respective cost values obtained;

d) selecting a first component from the list of exchange candidates and a second component from components adjacent to the first component, exchanging the positions of the first and second components with each other, performing a Monte-Carlo simulation at the optimum effective temperature based on a difference between the cost values before and after the exchange to determine whether or not the exchange is allowable, and deciding the placement after the exchange as a new placement if the exchange is allowable or the placement before the exchange as a new placement if the exchange is not allowable.

2. The method of claim 1, further comprising the steps of:

e) deciding the new placements for each component included in the list of exchange candidates N times, which is a predetermined number of times the placement is improved, and storing an exchange number M representing how many times the exchange has been allowed for each said component;

f) determining whether or not there are any candidate components, the exchange number M of which is equal to or larger than a predetermined number Nm (where Nm<N), in the list of exchange candidates, and registering the candidate components and drawing up a new list of exchange candidates if there are some, or ending the component placement if there are none; and g) repeatedly performing the steps c) through f) by using the new list of exchange candidates instead of the list of exchange candidates.

3. The method of claim 1, wherein the step c) comprises the steps of:

obtaining a cost difference per unit distance by dividing a difference, between the cost value for a component placement, obtained if two components are selected at random and the positions of the two components are exchanged with each other, and the cost value for a component placement before the exchange is performed, by a Manhattan distance between the two components; and obtaining a predetermined number n of cost differences per unit distance, calculating an average of the number n of differences, and defining the average calculated as the optimum effective temperature.

4. A computer readable storage medium in which a program for placing components by using a cost value in designing a semiconductor device is stored, the cost value being used for estimating a component placement and variable with an effective temperature as a parameter, the program making a computer function as:

a) means for inputting a net list and a cell library and performing an initial placement;

b) means for registering all of a number Ne of components existing in the net list an drawing up a list of exchange candidates;

c) means for selecting two components from the list of exchange candidates, obtaining the cost value of a component placement in which the positions of the two components are exchanged with each other and the cost value of a component placement before the exchange is performed, and deriving an optimum effective temperature based on the respective cost values obtained;

d) means for selecting a first component from the list of exchange candidates and a second component from components adjacent to the first component, exchanging the positions of the first and second components with each other, performing a Monte-Carlo simulation at the optimum effective temperature based on a difference between the cost values before and after the exchange to determine whether or not the exchange is allowable, and deciding the placement after the exchange as new placement if the exchange is allowable or the placement before the exchange as a new placement if the exchange is not allowable;

e) means for deciding the new placements for each component included in the list of exchange candidates N times, which is a predetermined number of times the placement is improved, and storing an exchange number M representing how many times the exchange has been allowed for each said component;

f) means for determining whether or not there are any candidate components, the exchange number M of which is equal to or larger than a predetermined number Nm (where Nm<N), in the list of exchange candidates, and registering the candidate components and drawing up a new list of exchange candidates if there are some, or ending the component placement if there are none; and g) means for sequentially operating the means c) through f) by using the new list of exchange candidates instead of the list of exchange candidates.

* * * * *